United States Patent [19]

Kalkhof et al.

[11] Patent Number: 4,567,537
[45] Date of Patent: Jan. 28, 1986

[54] TRANSISTOR-CONTROLLED-LOAD, SHORT-CIRCUIT-PROTECTED CURRENT-SUPPLY CIRCUIT

[75] Inventors: Bernd Kalkhof, Reutlingen; Karl Nagel, Gomaringen, both of Fed. Rep. of Germany

[73] Assignee: Robert Bosch GmbH, Stuttgart, Fed. Rep. of Germany

[21] Appl. No.: 540,295

[22] Filed: Oct. 11, 1983

[30] Foreign Application Priority Data

Oct. 21, 1982 [DE] Fed. Rep. of Germany ....... 3238880

[51] Int. Cl.⁴ .............................................. H02H 7/20
[52] U.S. Cl. ........................................ 361/18; 361/98; 323/315; 323/312
[58] Field of Search ....................... 361/18, 98, 88, 93, 361/94; 323/315, 316, 312, 313, 314

[56] References Cited

U.S. PATENT DOCUMENTS

| | | | |
|---|---|---|---|
| 3,796,943 | 3/1974 | Nelson et al. | 361/18 X |
| 4,177,416 | 12/1979 | Davis | 323/315 |
| 4,282,478 | 8/1981 | Leidich | 323/312 X |
| 4,338,646 | 7/1982 | Davis et al. | 361/18 |

OTHER PUBLICATIONS

Philips Technische Rondschau 1971/72, Nr. 1.

*Primary Examiner*—Patrick R. Salce
*Attorney, Agent, or Firm*—Frishauf, Holtz, Goodman & Woodward

[57] ABSTRACT

To limit the current through the emitter-collector path of an output transistor, typically a Darlington transistor pair (T7, T8) to a load, in case of short circuit or malfunction of the load (L), in which a control circuit path resistor (R1) is serially connected with the emitter-collector path of the output transistor and the load, a reference current source is provided, connected to have current flow additionally through the resistor (R1) and providing control current to the output transistor at a control terminal (2) thereof, thereby permitting self-regulation of output current to a safe level regardless of reflected load resistance.

8 Claims, 5 Drawing Figures

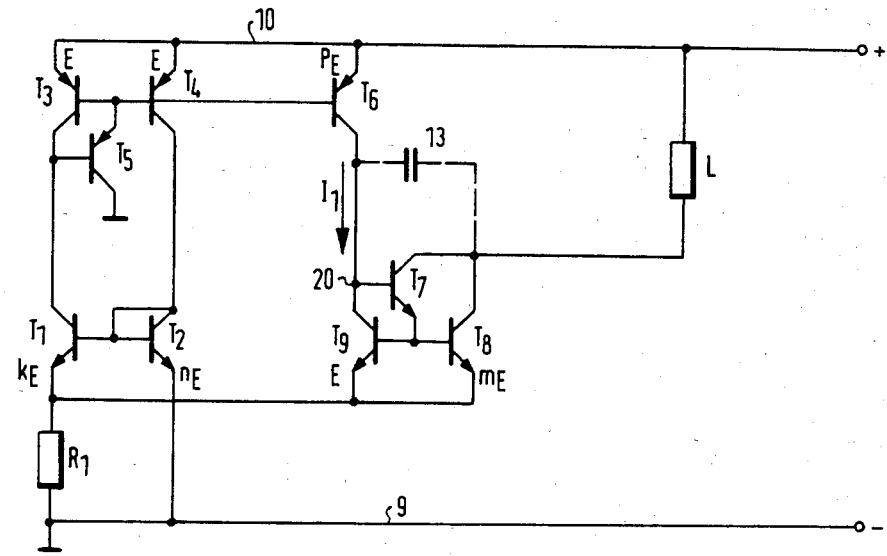
FIG. 1
FIG. 2
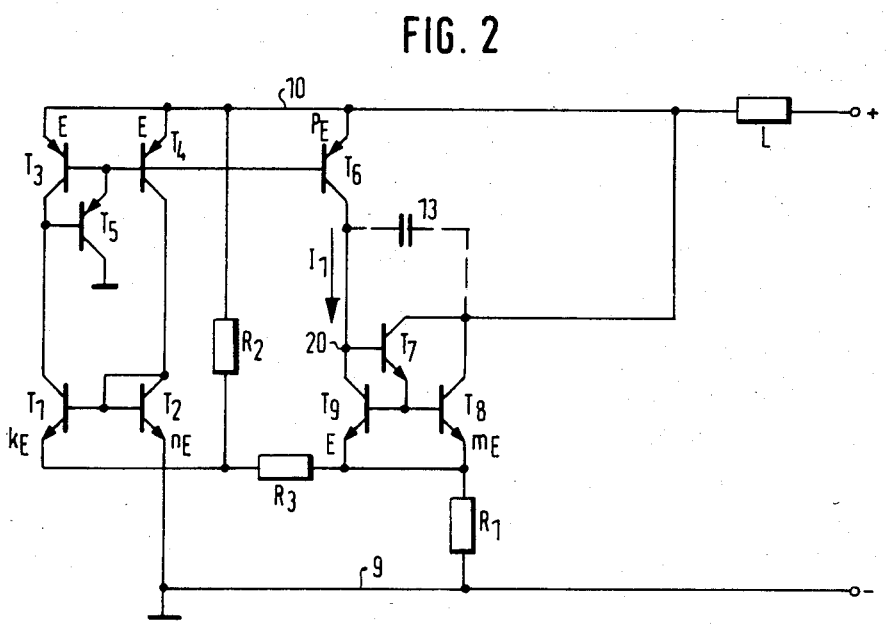

TRANSISTOR-CONTROLLED-LOAD, SHORT-CIRCUIT-PROTECTED CURRENT-SUPPLY CIRCUIT

The present invention relates to a load control circuit and more particularly to a transistorized load control circuit in which the at least one output transistor, which controls current flow to the load is protected against excessive currents arising, for example, due to short circuits at load.

BACKGROUND

It has previously been proposed to utilize current supply sources in which current flow to a load from a pair of power terminals is controlled by a transistor, which may be in form of a composite unit such as a Darlington-connected transistor unit. To provide appropriate control current for the transistor unit, a current supply therefor may, in turn, use a transistor circuit which is connected to the same supply terminals as the control transistor unit and load. The voltage at the supply terminals may, however, vary and circuitry has been developed to provide base current to the control transistor independently of voltage variations of the supply source.

Circuits of this type, in which an output transistor is used to connect or disconnect a load, can be applied for loads which are merely resistive, such as incandescent lamps, heaters, or the like, or which may be inductive, such as relays. Circuit arrangements can be constructed in discrete technology, in monolithically integrated technology, or in hybrid technology. The danger arises for all such transistor circuits, however, that if a short circuit should occur, for example due to failure in the load or the like, the current flow through the output transistor will be such that damage to, or destruction of, the output transistor may result.

Reference power sources, for example to supply reference or control power to the output transistor to control load current, referred to above, have previously been proposed in which the reference current becomes independent of supply line voltage. The above-referenced publication, Philips Technische Rundschau, Vol. 32, Jahrgang, 1971/72, Nr. 1, Page 8, FIG. 10 (Philips Technical Review), describes a reference source which furnishes reference supply current essentially independent of supply voltage. The current source is constructed as a ring network, using differential amplifier technology. Another type of ring-current supply source is described in the referenced German patent disclosure DE-OS No. 31 46 600, which uses a current mirror circuit and, additionally, has a temperature coefficient for the current which is readily reproducible. The circuit utilizes, for example, npn transistors, from which theoretically correct currents can be obtained; alternatively, ring current sources can be used, for example a current source having two separate source circuits, in which one of the source circuits is the reference current for the other. The final output current, then, is controlled by one of the two current sources. This current source is particularly suitable for integrated circuits, has low internal resistance, and is independent of supply voltage. The combination of two reference current sources, including a resistor which controls the output current, can be so interconnected that the two current sources generate similar currents in two branches.

THE INVENTION

It is an object to provide a load current control circuit having output transistors in which the output transistors are protected against short circuits, or other malfunction in the load, resulting in excessive output current, while keeping the advantages of control of the transistors by currents which are essentially independent of supply voltage.

Briefly, a dropping resistor is serially connected with an output transistor and load. A current supply circuit is provided coupled to the base of the transistor—which may be a Darlington unit—to supply control therethrough, the current supply circuit being connected to the power terminals and arranged to provide a control current essentially independent of voltage at the supply terminal. The current supply circuit is connected to the supply terminals through the dropping resistor; the current flow through the supply circuit is determined by the current through the resistor.

The system has the advantage that the current flow through the emitter-collector path of the output transistor is limited and, thus, the output transistor is protected in case of short circuit, or similar malfunction in the load.

The circuits can be readily modified, for example by increasing the amplification of the control current supply circuit, thus increasing the accuracy of short circuit current limitation. The circuit can be further expanded by including additional control loops, or control branches, for example to decrease the losses in the load circuit; to suppress undesired or spurious oscillations; to permit use with external power sources and the like.

DRAWINGS

FIG. 1 is a schematic circuit diagram of a basic circuit in accordance with the present invention; and FIGS. 2-5 are are schematic circuit diagrams of modifications of the basic circuit and illustrating different embodiments.

DETAILED DESCRIPTION

Figure 3:
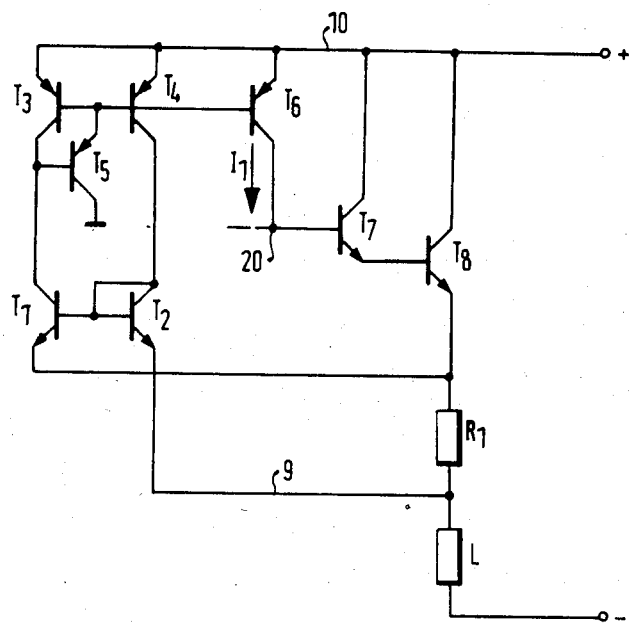

FIG. 1 illustrates the basic circuit having an output transistor unit formed of two npn resistors T7, T8, connected in a Darlington circuit and serially connected to the load L. The collector of the output transistor T7, T8 is connected to one terminal of the load L, the other terminal of which is connected to a positive terminal or bus 10 of the power supply, for example a battery. The battery may be a chargeable battery, for example a battery in an automotive vehicle, so that its output voltage will vary in dependence of the charge state of the battery and on connection of other loads, for example. The emitter of the output transistor T7, T8 is connected through an ohmic resistor R1 with the negative terminal of the battery, connected over a bus 9. A control terminal 20 is provided for connection to a control circuit which, under normal operation, controls the conduction state of the transistors T7, T8 forming the output transistor unit.

In accordance with the present invention, the ohmic resistor R1 forms a control path for a reference current source which is constructed in the form of a ring current source, connected between the positive and negative supply buses 10, 9. The positive supply bus 10 is connected to the positive terminal of the battery; the negative supply bus 9 is connected to the negative terminal of the battery. In accordance with a feature of the invention, the current $I_1$ derived from the reference source is connected to the control terminal 20 which, in turn, is connected to the base of the output transistors T7, T8. The reference current source used in this embodiment is, for example, described in the referenced literature, Philips Technical Review, Page 8, FIG. 10. An additional transistor T9 can be provided which has its emitter-base path connected in parallel to the emitter-base path of the transistor T8, and its collector connected to the base of the transistor T7, and hence to the control terminal 20. Transistor T9, together with with the transistor T7, T8, forms a current mirror circuit, the input of which is formed by the collector of the transistor T9 and the output by the collector of the transistor T8. The transistor T7 of the Darlington circuit will function as an input transistor, and as a base current amplifier of the current mirror circuit. The area of the emitter of transistor T9 is E. The transistor T8 may have an area of its emitter $m_E$, which differs from the area E of the emitter of transistor T9, and preferably is larger than the area E which means m is greater than one, or unity.

The ring current source, which forms the reference source, includes the transistors T1, T2, T3, T4, T5, T6. Transistors T1 and T2 are npn transistors; transistors T3, T4, T5, T6 are pnp transistors. Transistors T1 to T6 are connected as follows: transistor T3 has its emitter connected to the positive bus 10, and is collector to the collector of transistor T1. The base of transistor T3 is connected to the base of the transistors T4 and T6. The emitter of transistor T3 has the area E; the emitter of transistor T4 is connected to the supply bus 4, and it is collector to the collector of transistor T2. Transistor T4 has the emitter surface E. The bases of the transistors T3, T4 are connected over the emitter-base path of the transistor T5 with the collector of the transistor T3. The collector of transistor T5 is connected to the negative supply circuit 9. Transistors T3, T4, T5 operate in form of a current mirror circuit. Transistor T5 is a base current amplifier. The emitter of the transistor T1 has an emitter surface $k_E$ and is connected through the resistor R1 to the negative supply bus 9. Its base is connected to the base and to the collector of transistor T2. The emitter of transistor T2 has a surface $n_E$ and is connected to the negative supply button 9. An output coupling transistor T9 provides the output coupling current $I_1$ of the reference source. The emitter of transistor T6 has a surface area $p_E$ and is connected to the positive supply bus 10. The collector of the transistor T6 which supplies the output coupling current I1 is connected to the control terminal 20 of the output resistor T7, T8.

The ring current source here described is a simplified embodiment of the circuit disclosed in the above-mentioned "Philips Technical Review" article.

The collector of the transistor T6 is connected through a capacitor 13 with the collector of the output transistor T7, T8.

OPERATION

The pnp and the npn transistors are so selected that the current amplification thereof is high with respect to one, or unity; under those conditions, equality of current flow from the transistors T3, T4, T5 will result due to the current mirroring effect. The relationships of equations (1) and (2)—see table at the end of the specification—will obtain, in which $U_T = k/q\ T$ is the temperature voltage, k the Boltzmann constant, q the elementary charge, T the absolute temperature, and $I_S$ the saturation current. The voltage drop $U_{R1}$ across resistor R1 is defined in formula 3, below. The currents $I_1$, $I_2$ are defined in formulas 4 and 5, in which the factors m and p define the respective emitter areas referred to above.

The circulating current on the transistors T1, T2 and resistor R1 can be determined from the relationship (6).

Substituting the values from the equations (1), (2), (5) in equation (6), one obtains the current $I_2$ defined in equation (7).

As can be seen from equation (7), the output current flowing through the emitter-collector path of the output transistor, T7, T8, under short circuit conditions, will, considering also the third transistor T9, be limited to the value defined in equation (7). The voltage $U_T$, as above defined, is a temperature voltage. In actual practice, m and p will be large in order to obtain higher output currents. If the third transistor T9 is omitted, then p will approach infinity, and equation (7) will be changed to equation (7a).

The temperature voltage $U_T$ is proportional to the absolute temperature. The temperature coefficient of physical elements $+3.3°_{oo}/K$. If the resistor R1 has the same temperature coefficient then the system is temperature compensated. It is desirable to select a temperature coefficient of resistance for the resistor R1 which is greater than the temperature coefficient of the temperature voltage $U_T$ so that, as the temperature rises, the output current will become smaller, consequently resulting in lower circuit losses. A suitable resistor is a metallic resistor having a temperature coefficient of $3.9°/_{oo}/K$.

Embodiment of FIG. 2: The circuit differs from the circuit of FIG. 1 in that the positive bus 10 is connected to the collector of output transistor T7, T8 and the load is serially connected therewith to the positive terminal of the battery. The reference source current is, again, connected between the positive bus 10 and the negative system bus 9. Resistor R1 is connected between the emitter of the transistor T8 and the negative bus 9. The emitters of the transistors T8, T9 are connected together and connected through the resistor R3 with the transistor T1. A resistor R2 is connected between the emitter of transistor T1 and the positive bus 10.

Introducing the resistors R2 and R3 decreases the dependence of the current flow through the load L on the voltage between the operating or supply buses 9, 10 with respect to the embodiment of FIG. 1.

Embodiment of FIG. 3: The basic system is similar to that of FIG. 1 or 2. The load L, however, is connected in the emitter circuit of the output transistors T7, T8, the collectors of which are connected to the positive supply bus 10. The control circuit of the reference current source, namely the resistor R1, is connected between the emitter of the output transistor T7, T8 and the load L, the negative supply bus 9 being connected to the junction between the resistor R1 and one terminal of the load L, the other terminal of which is connected to the negative supply terminal, similar to the connection of FIG. 2. Of course, the load could, equally, be connected as shown in FIG. 1, with reverse polarity.

Figure 4:
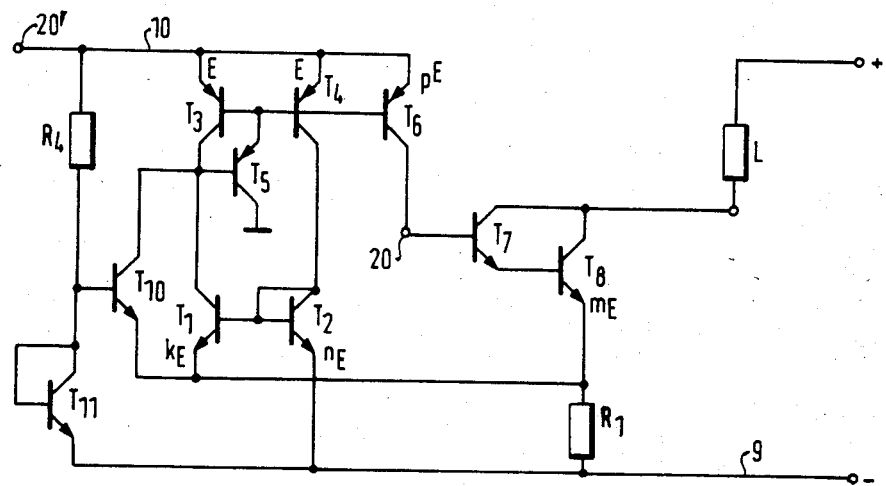
Figure 5:
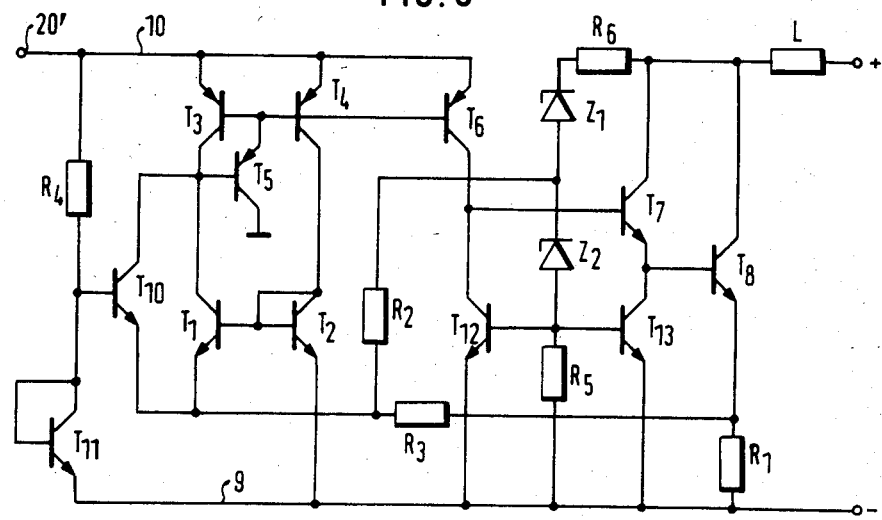

Embodiment of FIGS. 4 and 5: The voltage for the reference source is not derived from the operating bus 10—in contrast to the embodiment of FIGS. 1-3, where only a single supply line is provided. In accordance with the embodiments of FIGS. 4 and 5, operating supply voltage 10 is separated from the positive terminal of the supply battery and, instead, is connected to an external terminal 20'. Terminal 20' is the control connection for the entire circuit and is used similar to the junction 20 which continues to be connected to the base of the output transistor T7, T8. The terminal 20' in the embodiments of FIGS. 4 and 5 will receive the control signal which, in the embodiment of FIGS. 1–3 was connected directly to the terminal 20 and hence to the base of the output transistor. The entire circuit arrangements of FIGS. 4 and 5 thus operate in form of a modified Darlington transistor.

The embodiments of FIGS. 4 and 5 include a further modification, namely a start-up circuit which is provided to start the reference current source. Transistors T10, T11, and resistor R4 are used for that purpose. The embodiment of FIG. 5, additionally, includes a current feed-back control loop which uses the resistors R2, R3, discussed in connection with FIG. 2.

The circuit can, additionally, be modified by including the resistors R5, R6, transistors T12, T13, and Zener diodes Z1, Z2, see circuit of FIG. 5. The detailed circuitry is clearly shown in the respective figures and, since it is similar in general to the circuits of FIGS. 1–3, the above differences need not be discussed in detail.

OPERATION

Let it be assumed that the collector-emitter voltage at the output transistors T7, T8 is less than the break-down voltage of the zener diode Z1. Under that condition, the circuit will operate in its normal mode, and the current will be limited to that defined in equation 7a.

If the collector-emitter voltage of the output transistor T7, T8 is between the break-down voltage of the zener diode Z1 and the sum of the break-down voltages of the two zener diodes Z1, Z2, then a current feed-back control of the current in accordance with the respective collector-emitter voltage will result.

The collector-emitter voltage of the output transistor T7, T8 may be higher than the sum of the break-down voltages of the two zener diodes Z1, Z2. Under this condition, the transistors T12, T13 will become conductive, so that the control current from the collector of transistor T6 is drawn to the negative bus 9, causing the output transistor T7, T8 to block. The collector-emitter voltage of transistor T7, T8 controlling current to load L can rise further without destroying the output transistor T7, T8, due to overload. Mathematically, the relationship of equation (8) will obtain.

The resistor R5 draws off blocking currents of the transistors T12, T13, and is provided, further, to operate a zener diode Z1, Z2 at a predetermined operating or working point. The zener voltages can be selected so that over-voltage turn-off, or negative feed-back control, will be matched to required operating conditions, that is, the limit of "normal" operation can be set as desired.

The specific connection of the transistors T7, T8 shown, for example, in the drawings, in which the control signal is applied, directly (FIGS. 1–3) or indirectly (FIGS. 4, 5) to the base of one of the Darlington transistors provides a circuit in which the short circuit current is accurately limited since the amplification is high due to the Darlington transistor connection. Use of the additional transistor T9 and the resistor combination R2, R3—see FIG. 2, FIG. 5—and connecting the load serially with the power source permits lower-loss operation since the current flowing through the load L as a function of the voltage between the supply buses 10, 11 is decreased. The use of the zener diodes, Z1, Z2—see FIG. 5—results in operation in which the currents are defined by the voltage conditions across the load and undesired oscillations which otherwise might result upon repetitive changes in supply voltage are effectively repressed.

Various changes and modifications may be made in features described in connection with any one of the embodiments may be used with any of the others, within the scope of the inventive concept.

In a typical operating example, the following values were suitable.

Referring to the circuit of FIG. 1, supply voltage between buses 9, 10: ±14 V Transistors T7, T8, T9: Emitter-area T8:T9=128:1; T7=1 Emitter Transistors T1, T2: Emitter-area T1:T2=10:1

Transistors T3, T4, T5: Emitter-area 1 Emitter each

Transistor T6: Emitter-area 6 Em.

Resistor R1: 93 mΩ Load current: 0.25 A Short Circuit Current: 0.4 A

In a modification of FIG. 2, all other values being the same as for FIG. 1, the resistors R2, R3 were: R2=9 kΩ, R3=22Ω

Voltage at terminal 20: $V_{20} = 1.4$ V

In the embodiments of FIGS. 4 and 5,

Zener diodes Z1, Z2: $V_{Z1/2} \leq V_{BEO}$ of T7, T8

Resistors R4=15 K

Resistors R5=1 K

Resistors R6=5 K

Voltage at terminal 20': $V_{20'} = 5$ V

TABLE OF FORMULAS (1) $\quad U_{BE1} = U_T \cdot \ln \dfrac{I_o}{k \cdot I_S}$ and (2) $\quad U_{BE2} = U_T \cdot \ln \dfrac{I_o}{n \cdot I_S}$, (3) $\quad U_{R1} = R_1 \cdot (I_o + I_1 + I_2)$.

(4) $\quad I_1 = m \cdot I_o$.

(5) $\quad I_2 = p \cdot I_1$.

(6) $\quad U_{R1} = U_{BE2} - U_{BE1}$.

(7) $\quad I_2 = \dfrac{U_T}{R_1} \cdot \dfrac{1}{1 + \dfrac{1}{p} + \dfrac{1}{mp}} \cdot \ln \dfrac{k}{n}$ (7a) $\quad I_2 = \dfrac{U_T}{R_1} \cdot \ln \dfrac{k}{n}$.

(8) $\quad U_{CE\,max} < U_{CBO}$.

We claim:

1. Load short circuit protected current supply circuit, adapted for connection to a load (L) and being supplied with electrical power from a pair of power terminals (+, −) having an output transistor (T7, T8);

a dropping or current control resistor (R1), the emitter-collector path of the output transistor, and of the dropping resistor being connected in a series circuit which, in turn, is serially connected to the load (L) and to the power terminals;

and a current supply circuit (T1–T6) coupled to the base of the output transistor (T7, T8) to control current flow therethrough independently of supply voltage, said current supply circuit being connected to include said dropping resistor (R1) for controlled current flow to the base of the output transistor as a function of, and as determined by, the value of said resistor;

wherein the output transistor comprises a transistor pair including a first transistor (T8) and a second transistor (T7) both transistors of the pair being of the same conductivity type (npn); and a third transistor (T9) having the same conductivity type as the transistors (T8, T7) of said transistor pair, the emitter-base path of the third transistor being connected in parallel to the emitter-base path of the first transistor (T8), the collector of the third transistor being connected to the base of the second transistor, said three transistors (T7, T8, T9) forming a current mirror circuit, the input to the current mirror circuit being formed by the base of the second transistor (T7) and the output of the current mirror circuit being formed by the commonly connected collectors of the first and second transistors (T8, T7).

2. Circuit according to claim 1 further including a reference current source (9, 10) having a pair of supply buses, the current supply circuit being connected to said supply buses;

and wherein one (9) of said supply buses is connected to one (−) of the pair of power terminals (+,−).

3. Circuit according to claim 2 wherein (FIG. 2, FIG. 5) the current supply circuit includes a fourth transistor (T1) having the same conductivity type as said first and second transistors (T8, T7) of the transistor pair;

the emitter of the fourth transistor being coupled to the dropping resistor (R1);

further including a second resistor (R3) connected between the emitter of the fourth transistor (T1) and the dropping resistor (R1); and a third resistor (R2) connected to the emitter of the first transistor (T1) and, further, being coupled to one (+) of the pair of power terminals (+,−).

4. Circuit according to claim 3 further including (FIGS. 1, 2, 3) a reference current source (9, 10) having a pair of supply buses;

and wherein the reference current source receives its operating voltage from the pair of power terminals.

5. Circuit according to claim 1 wherein the collector of the second transistor (T7) is connected to the collector of the first transistor (T8), the emitter of the second transistor (T7) is connected to the base of the first transistor (T8), and the base of the second transistor (T7) forms a control terminal (20) of the transistor pair.

6. Load short circuit protected current supply circuit, adapted for connection to a load (L) and being supplied with electrical power from a pair of power terminals (+, −) having an output transistor (T7, T8);

a dropping or current control resistor (R1), the emitter-collector path of the output transistor and of the dropping resistor being connected in a first series circuit which, in turn, is serially connected to the load (L) and to the power terminals;

and a current supply circuit (T1–T6) coupled to the base of the output transistor (T7, T8) to control current flow therethrough independently of supply voltage, said current supply circuit being connected to include said dropping resistor (R1) for controlled current flow to the base of the output transistor as a function of, and as determined by, the value of said dropping resistor (R1);

wherein the output transistor comprises a transistor pair including a first transistor (T8) and a second transistor (T7), both the first and second transistors of the pair being of the same conductivity type (npn) and having their collectors connected in common, and a fifth and a sixth transistor (T12, T13) having the same conductivity type as the first and second transistors (T8, T7) of said transistor pair, wherein the current supply circuit includes a fourth transistor (T1) having the same conductivity type as said first and second transistors (T8, T7) of the transistor pair, the emitter of the fourth transistor being coupled to the dropping resistor (R1);

said current supply circuit further includes a second resistor (R3) connected between the emitter of the fourth transistor (T1) and the dropping resistor (R1);

a third resistor (R2) connected to the emitter of the fourth transistor (T1);

a second series circuit comprising a first Zener diode (Z1), a second Zener diode (Z2), a fourth resistor (R6) and a fifth resistor (R5);

and wherein said third resistor (R2) is further coupled to a junction formed by the portion of the series circuit including the fourth resistor (R6) and the first Zener diode (Z1) with the portion of the series circuit formed by the second Zener diode (Z2) and the fifth resistor (R5);

the bases of the fifth transistor (T12) and of the sixth transistor (T13) being connected to the junction between a respective Zener diode (Z2) and the fifth resistor (R5) of one of said portions of the second series circuit, and the emitters of the fifth and sixth transistors (T12, T13) being connected to one (9) of the pair of power terminals, the collector of the fifth transistor (T12) being coupled to the base of the second transistor (T7) of the transistor pair (T8, T7) and the collector of the sixth transistor (T13) being coupled to the base of the first transistor (T8) of the pair;

said first and second transistors (T7, T8) and the fifth and sixth transistors (T12, T13) forming a current mirror circuit, the input to the current mirror circuit being formed by the base of the second transistor (T7), and the output of the current mirror circuit being formed by the commonly connected collectors of the first and second transistors (T8, T7).

7. Load short circuit protected supply circuit, adapted for connection to a load (L) and being supplied with electrical power from a pair of power terminals (+, −) having a reference current source (20, 20') having a pair of supply buses, one of the reference current source supply buses including a control terminal (20');

an output transistor (T7, T8);

a dropping or current control resistor (R1), the emitter-collector path of the output transistor and of the dropping resistor being connected in a series circuit which, in turn, is serially connected to the load (L) and to the power terminals;

and a current supply circuit (T1–T6) coupled to the base of the output transistor (T7, T8) and to said reference current source (20, 20') to control current flow therethrough independently of supply voltage, said current supply circuit being connected to include said dropping resistor (R1) for controlled current flow to the base of the output transistor as a function of, and as determined by, the value of said dropping resistor (R1);

wherein the output transistor comprises a transistor pair including a first transistor (T8) and a second transistor (T7), both the first and second transistors of the pair being of the same conductivity type (npn) and having their collectors connected in common, a third transistor (T9) having the same conductivity type as the transistors (T8, T7) of said transistor pair, the emitter-base path of the third transistor being connected in parallel to the emitter-base path of the first transistor (T8), the collector of the third transistor being connected to the base of the second transistor, said first, second and third transistors (T7, T8, T9) forming a current mirror circuit, the input to the current mirror circuit being formed by the base of the second transistor (T7) and the output of the current mirror circuit being formed by the commonly connected collectors of the first and second transistors (T8, T7);

and the control terminal (20') being coupled to the base of one (T7) of the transistors of said transistor pair.

8. Load short circuit protected supply circuit, adapted for connection to a load (L) and being supplied with electrical power from a pair of power terminals (+, −) having a reference current source (20, 20') having a pair of supply buses, one of the reference current source supply buses including a control terminal (20');

an output transistor (T7, T8);

a dropping or current control resistor (R1), the emitter-collector path of the output transistor and of the dropping resistor being connected in a first series circuit which, in turn, is serially connected to the load (L) and to the power terminals;

and a current supply circuit (T1–T6) coupled to the base of the output transistor (T7, T8) and to said reference current source (20, 20') to control current flow therethrough independently of supply voltage, said current supply circuit being connected to include said dropping resistor (R1) for controlled current flow to the base of the output transistor as a function of, and as determined by, the value of said dropping resistor (R1);

wherein the output transistor comprises a transistor pair including a first transistor (T8) and a second transistor (T7), both the first and second transistors of the pair being of the same conductivity type (np) and having their collectors connected in common, and a fifth and a sixth transistor (T12, T13) having the same conductivity type as the transistors (T8, T7) of said transistor pair, wherein the current supply circuit includes a fourth transistor (T1) having the same conductivity type as said first and second transistors (T8, T7) of the transistor pair, the emitter of the fourth transistor being coupled to the dropping resistor (R1);

said current supply circuit further includes a second resistor (R3) connected between the emitter of the fourth transistor (T1) and the dropping resistor (R1);

a second series circuit comprising a first Zener diode (Z1), a second Zener diode (Z2), a fourth resistor (R6) and a fifth resistor (R5);

a third resistor (R2) connected to the emitter of the first transistor (T1) and, further, being coupled to one (+) of the pair of power terminals (+, −);

and wherein said third resistor (R2) is coupled to a junction formed by the portion of the series circuit including the fourth resistor (R6) and the first Zener diode (Z1) with the portion of the series circuit formed by the second Zener diode (Z22) and the fifth resistor (R5);

the bases of the fifth transistor (T12) and of the sixth transistor (T13) being connected to the junction between a respective Zener diode (Z2) and the fifth resistor (R5) of one of said portions of the second series circuit; and the emitters of the fifth and sixth transistors (T12, T13) being connected to one (9) of the pair of power terminals, the collector of the fifth transistor (T12) being coupled to the base of the second transistor (T7) of the transistor pair (T8, T7) and the collector of the sixth trnsistor (T13) being coupled to the base of the first transistor (T8) of the pair;

said first and second transistors (T7, T8) and the fifth and sixth transistors (T12, T13) forming a current mirror circuit, the input to the current mirror circuit being formed by the base of the second transistor (T7), and the output of the current mirror circuit being formed by the commonly connected collectors of the first and second transistors (T8, T7), and the control terminal (20') being coupled to the base of one (T7) of the transistors of said transistor pair.

* * * * *